(12) United States Patent
Haddad et al.

(10) Patent No.: US 11,929,382 B2
(45) Date of Patent: *Mar. 12, 2024

(54) SHALLOW TRENCH TEXTURED REGIONS AND ASSOCIATED METHODS

(71) Applicant: SiOnyx, LLC, Beverly, MA (US)

(72) Inventors: Homayoon Haddad, Beaverton, OR (US); Jutao Jiang, Tigard, OR (US)

(73) Assignee: SIONYX, INC., Beverly, MA (US)

( * ) Notice: Subject to any disclaimer, the term of this patent is extended or adjusted under 35 U.S.C. 154(b) by 198 days.

This patent is subject to a terminal disclaimer.

(21) Appl. No.: 17/369,384

(22) Filed: Jul. 7, 2021

(65) Prior Publication Data

US 2021/0335878 A1  Oct. 28, 2021

Related U.S. Application Data

(63) Continuation of application No. 16/505,283, filed on Jul. 8, 2019, now Pat. No. 11,069,737, which is a (Continued)

(51) Int. Cl.
*H01L 27/146* (2006.01)
*B23K 26/352* (2014.01)
(Continued)

(52) U.S. Cl.
CPC ...... *H01L 27/14643* (2013.01); *B23K 26/355* (2018.08); *B82Y 40/00* (2013.01); *H01L 27/14625* (2013.01); *H01L 27/14629* (2013.01); *H01L 27/1463* (2013.01); *H01L 27/14632* (2013.01); *H01L 27/1464* (2013.01); *H01L 27/14689* (2013.01); *H01L 31/02327* (2013.01); *H01L 31/028* (2013.01); *H01L 31/182* (2013.01)

(58) Field of Classification Search
CPC ........... H01L 27/4643; H01L 27/14632; H01L 27/14689; H01L 31/4632; H01L 31/182
See application file for complete search history.

(56) References Cited

U.S. PATENT DOCUMENTS

2008/0295887 A1* 12/2008 Moslehi .............. H01L 31/0352
257/E27.125
2009/0162966 A1   6/2009 Jawarani et al.
(Continued)

FOREIGN PATENT DOCUMENTS

CN         102947953 A     2/2013

OTHER PUBLICATIONS

Japan Application No. 111126448, Office Action dated Apr. 18, 2023.
(Continued)

*Primary Examiner* — Yu-Hsi D Sun
(74) *Attorney, Agent, or Firm* — Troutman Pepper Hamilton Sanders LLP (Rochester)

(57) ABSTRACT

Photosensitive devices and associated methods are provided. In one aspect, for example, a photosensitive imager device can include a semiconductor layer having multiple doped regions forming a least one junction, a textured region coupled to the semiconductor layer and positioned to interact with electromagnetic radiation. The textured region can be formed from a series of shallow trench isolation features.

20 Claims, 3 Drawing Sheets

Related U.S. Application Data continuation of application No. 15/614,256, filed on Jun. 5, 2017, now Pat. No. 10,347,682, which is a continuation of application No. 14/884,181, filed on Oct. 15, 2015, now Pat. No. 9,673,250, which is a continuation of application No. 14/084,392, filed on Nov. 19, 2013, now Pat. No. 9,209,345.

(60) Provisional application No. 61/841,326, filed on Jun. 29, 2013.

(51) Int. Cl.
  *B82Y 40/00* (2011.01)
  *H01L 31/0232* (2014.01)
  *H01L 31/028* (2006.01)
  *H01L 31/18* (2006.01)

(56) References Cited

U.S. PATENT DOCUMENTS

| | | | | |
|---|---|---|---|---|
| 2009/0256226 A1* | 10/2009 | Tatani | ............... | H01L 27/14831 257/E21.546 |
| 2010/0059803 A1* | 3/2010 | Gidon | ................. | H01L 27/1464 257/292 |
| 2013/0285130 A1* | 10/2013 | Ting | ..................... | H01L 27/146 438/57 |

OTHER PUBLICATIONS

Chinese Application No. 201911004626.9, Office Action dated Apr. 26, 2023.

* cited by examiner

SHALLOW TRENCH TEXTURED REGIONS AND ASSOCIATED METHODS

PRIORITY DATA

This application is a continuation of U.S. patent application Ser. No. 16/505,283, filed Jul. 8, 2019, which is a continuation of U.S. patent application Ser. No. 15/614,256, filed on Jun. 5, 2017, which is a continuation of U.S. patent application Ser. No. 14/884,181, filed on Oct. 15, 2015, which is a continuation of U.S. patent application Ser. No. 14/084,392, filed Nov. 19, 2013, which claims the benefit of U.S. provisional patent application No. 61/841,326, filed on Jun. 29, 2013, each of which is incorporated herein by reference in their entireties.

BACKGROUND

The interaction of light with semiconductor materials has been a significant innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having improved performance. Many traditional CMOS imagers utilize front side illumination (FSI). In such cases, electromagnetic radiation is incident upon the semiconductor surface containing the CMOS devices and circuits. Backside illumination (BSI) CMOS imagers have also been used, and in many designs electromagnetic radiation is incident on the semiconductor surface opposite the CMOS devices and circuits. CMOS sensors are typically manufactured from silicon and can covert visible incident light into a photocurrent and ultimately into a digital image. Silicon-based technologies for detecting infrared incident electromagnetic radiation have been problematic, however, because silicon is an indirect bandgap semiconductor having a bandgap of about 1.1 eV. Thus the absorption of electromagnetic radiation having wavelengths of greater than about 1100 nm is, therefore, very low in silicon.

SUMMARY

The present disclosure provides optoelectronic devices having enhanced light absorption characteristics, including systems incorporating such devices and various associated methods. In one aspect, for example, an optoelectronic device having enhanced absorption of electromagnetic radiation is provided. Such a device can include a semiconductor layer coupled to a support substrate and an array of shallow trench isolation surface features positioned between the semiconductor layer and the support substrate, the surface features positioned to interact with electromagnetic radiation that passes through the semiconductor layer. In one aspect, the semiconductor layer is single crystal silicon. In another aspect, a device layer can be coupled to the semiconductor layer on a side opposite the surface features.

In one aspect, a first bonding layer can be coupled between the semiconductor layer and the support substrate. While various configurations are contemplated, in one specific aspect first bonding layer can be coupled between the support substrate and the surface features. In another aspect, a second bonding layer can be positioned between the first bonding layer and the support substrate. In yet another aspect, a reflector layer can be disposed between the first bonding layer and the second bonding layer.

The surface features can have a variety of configurations and can be formed in a variety of locations between the semiconductor layer and the semiconductor support. For example, in one aspect the surface features can be formed in the support substrate. In another aspect, the surface features can be formed in the semiconductor layer. Furthermore, in one aspect the surface features can be arranged according to a predetermined pattern. In one specific aspect, such a predetermined pattern can be an at least substantially uniform grid. In specific aspect, such a predetermined pattern can be a non-uniform arrangement. Additionally, in one aspect the surface features can have an at least substantially uniform height. In another aspect, the surface features are not uniform in height.

Additionally, a variety of architectural configurations are contemplated. For example, in one aspect the device can be architecturally configured as a front-side illuminated optoelectronic device. In another aspect, the device can be architecturally configured as a back-side illuminated optoelectronic device.

In another aspect, a method of making an optoelectronic device is provided. Such a method can include creating an array of surface features using shallow trench isolation etching and bonding the array of surface features between a support substrate and a semiconductor layer. In another aspect, creating the array of surface features can further include creating the array of surface features on at least a portion of a surface of the semiconductor layer. In yet another aspect, creating the array of surface features further includes creating the array of surface features on at least a portion of a surface of the support substrate. Furthermore, in one aspect bonding the array of surface features between the support substrate and the semiconductor layer can further include depositing a first bonding layer onto the semiconductor layer and bonding the first bonding layer to a second bonding layer disposed on the support substrate. In some aspects a reflector can be deposited on at least one of the first bonding layer or the second bonding layer prior to bonding the semiconductor layer to the support substrate. In a further aspect the method can include thinning the semiconductor layer at a surface opposite the support substrate to a thickness of from about 1 microns to about 10 microns to create a pristine thinned surface and forming a device layer on the thinned surface. The semiconductor can then be further processed as desired to form the optoelectronic device.

BRIEF DESCRIPTION OF THE DRAWINGS

For a further understanding of the nature and advantage of the present disclosure, reference is being made to the following detailed description of embodiments and in connection with the accompanying drawings, in which.

DETAILED DESCRIPTION

Figure 1:
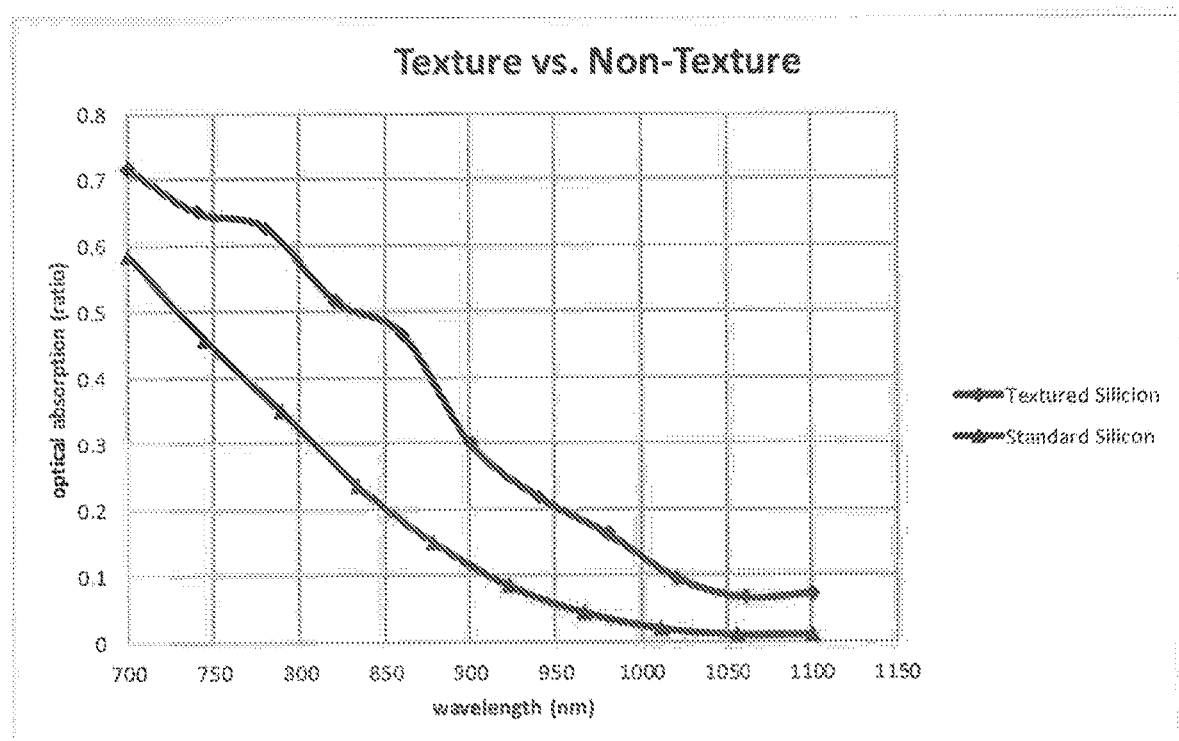
FIG. 1 provides data showing the optical absorption of textured silicon compared to standard silicon as a function of wavelength in accordance with an embodiment of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "light" and "electromagnetic radiation" can be used interchangeably and can refer to electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are considered to be longer than about 800 nm or shorter than about 350 nm. Furthermore, the infrared spectrum is considered to include a near infrared portion of the spectrum including wavelengths of approximately 800 to 1100 nm, a short wave infrared portion of the spectrum including wavelengths of approximately 1100 nm to 3 micrometers, and a mid-to-long wavelength infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "frontside illumination" refers to a device architecture design whereby electromagnetic radiation is incident on a surface of a semiconductor material that contains the device circuitry. In other words, electromagnetic radiation is incident upon and passes through the device circuitry region prior to contacting the semiconductor material.

As used herein, the term "absorptance" refers to the fraction of incident electromagnetic radiation absorbed by a material or device.

As used herein, the terms "textured layer" and "textured surface" can be used interchangeably, and refer to a surface having a topology with nano- to micron-sized surface variations. Such a surface topology can be formed by a variety of known STI techniques. It is noted that laser ablation techniques, at least in one aspect, are specifically disclaimed. While the characteristics of such a surface can be variable depending on the materials and techniques employed, in one aspect such a surface can include micron-sized structures (e.g. about 1 µm to about 10 µm). In yet another aspect, the surface can include nano-sized and/or micron-sized structures from about 5 nm and about 10 µm. In another aspect, surface structures can be from about 100 nm to about 1 micron. A variety of criteria can be utilized to measure the size of such structures. For example, for cone-like structures the above ranges are intended to be measured from the peak of a structure to the valley formed between that structure and an adjacent neighboring structure. For structures such as nanopores, the above ranges are intended to be approximate diameters. Additionally, the surface structures can be spaced at various average distances from one another. In one aspect, neighboring structures can be spaced at a distance of from about 50 nm to about 2 µm. Such spacing is intended to be from a center point of one structure to the center point of a neighboring structure.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

Traditional silicon photodetecting imagers have limited light absorption/detection properties. For example, such silicon based detectors can be mostly transparent to infrared light, particularly with thin silicon layers. In some cases, other materials such as InGaAs can be used to detect infrared light having wavelengths greater than about 1000 nm, silicon is still commonly used to detect wavelengths in the visible spectrum (i.e. visible light, 350 nm-800 nm). Traditional silicon materials require substantial optical path lengths to detect photons from electromagnetic radiation having wavelengths longer than approximately 700 nm. As a result, visible light can be absorbed at relatively shallow depths in silicon, and absorption of longer wavelengths (e.g. 900 nm) in silicon of a standard wafer depth (e.g. approximately 750 μm) is poor. Increasing the thicknesses of the silicon layer to allow longer wavelength absorption thus greatly increases the thicknesses of the photodetecting imager.

The optoelectronic devices according to aspects of the present disclosure exhibit increased light absorption due to an increase in the effective optical path length for longer wavelengths of light as compared to traditional devices. The absorption depth in conventional silicon detectors is the depth into silicon at which the radiation intensity is reduced to about 36% of the value at the surface of the semiconductor. The increased optical path length of photons with the present silicon materials results in an apparent reduction in the absorption depth, or a reduced apparent or effective absorption depth. For example, the effective absorption depth of silicon can be reduced such that these longer wavelengths can be absorbed in silicon layers that are less than 850 microns thick. In other words, by increasing the optical path length, these devices are able to absorb longer wavelengths (e.g. >1000 nm for silicon) within a thinner silicon material. In addition to absorbing light having longer wavelengths in thin silicon materials (e.g. less than 30 microns thick as compared to 700 microns thick), the response rate or response speed can also be increased by using such thin materials.

The optoelectronic devices of the present disclosure can be front side illumination (FSI) or back side illumination (BSI) devices. In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can thus be disposed on the topside of a FSI pixel to direct and focus the incident light to the light sensing active region of the device, thus at least partially avoiding the circuitry. A variety of lenses and lens configurations are contemplated, however in one aspect the lens can be a micro-lens.

BSI imagers, one the other hand, are configured such that incident light enters the device via the light sensitive region opposite the circuitry and is mostly absorbed prior to reaching the circuitry, thus greatly reducing scattering and/or noise. BSI designs also allow for greater sensitivity, smaller pixel architecture, and a high fill factor for the imager. Additionally, it should also be understood that devices according to aspects of the present disclosure, whether they be FSI or BSI, can be incorporated into complimentary metal-oxide-semiconductor (CMOS) imager architectures or charge-coupled device (CCD) imager architectures.

Generally, and without limitation, the present disclosure provides a variety of optoelectronic devices, such as, broadband photosensitive diodes, pixels, and imagers capable of detecting visible as well as infrared electromagnetic radiation, including associated methods of making such devices. In one specific aspect, for example, an optoelectronic device is provided having enhanced absorption of electromagnetic radiation. Such a device can include a semiconductor layer coupled to a support substrate and an array of shallow trench isolation surface features positioned between the semiconductor layer and the support substrate, the surface features positioned to interact with electromagnetic radiation that passes through the semiconductor layer.

It has thus been discovered that such an array of shallow trench isolation surface features positioned in an architecturally appropriate manner can greatly increase the optical absorption of silicon materials. As is shown in FIG. 1, for example, such a textured region can increase the optical absorption of silicon as compared to non-textured silicon over an electromagnetic spectrum range of at least about 700 nm to about 1100 nm.

Figure 2:
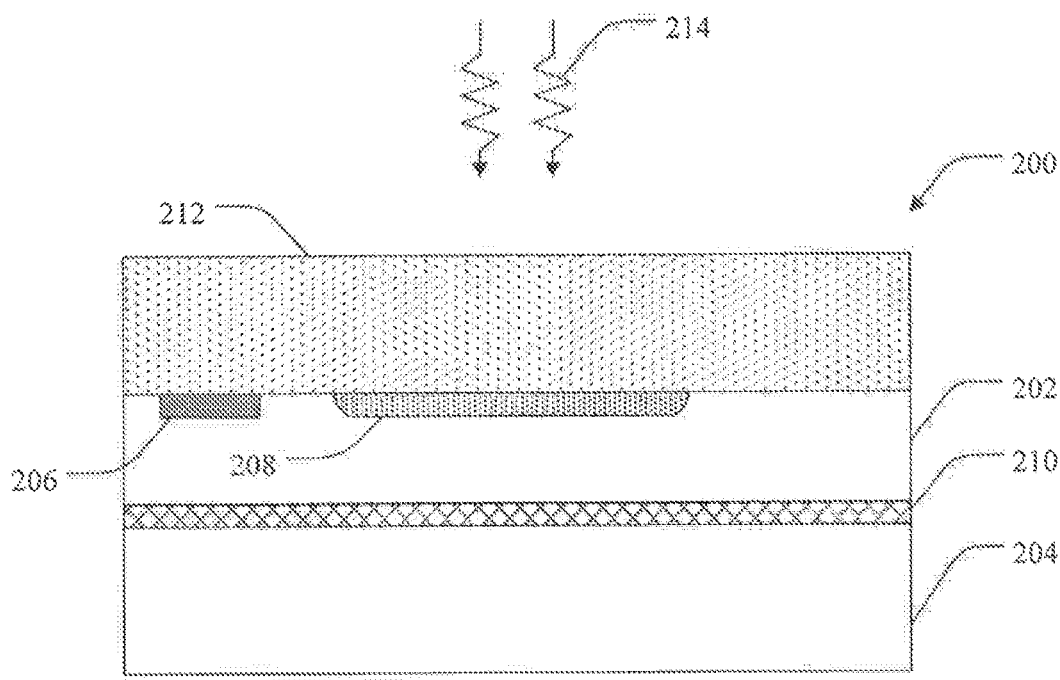
FIG. 2 is a cross-sectional view of an image sensor in accordance with another embodiment of the present disclosure.

As can be seen in FIG. 2, for example, a FSI device is shown 200 having a semiconductor layer 202 coupled to a support substrate 204, where the semiconductor layer can include one or more doped regions 206, 208, that form at least one junction. A textured layer 210 including an array or plurality of STI surface features is positioned between the semiconductor layer 202 and the support substrate 204. A circuitry layer 212 is coupled to the semiconductor layer 202 on a side opposite the support substrate 204. Light 214 is shown impinging on the device 200 and passing through the circuitry layer 212 prior to contacting the semiconductor layer 202. Light 214 that is not absorbed by and subsequently passes through the semiconductor layer 202 contacts the textured layer 210 and is redirected back into the semiconductor layer 202, thus allowing light to be absorbed in a subsequent pass. As such, the textured layer 210 increases the effective optical path length of the light 214 as it passes through the device. In one aspect, the semiconductor layer can be single crystal silicon.

Figure 3:
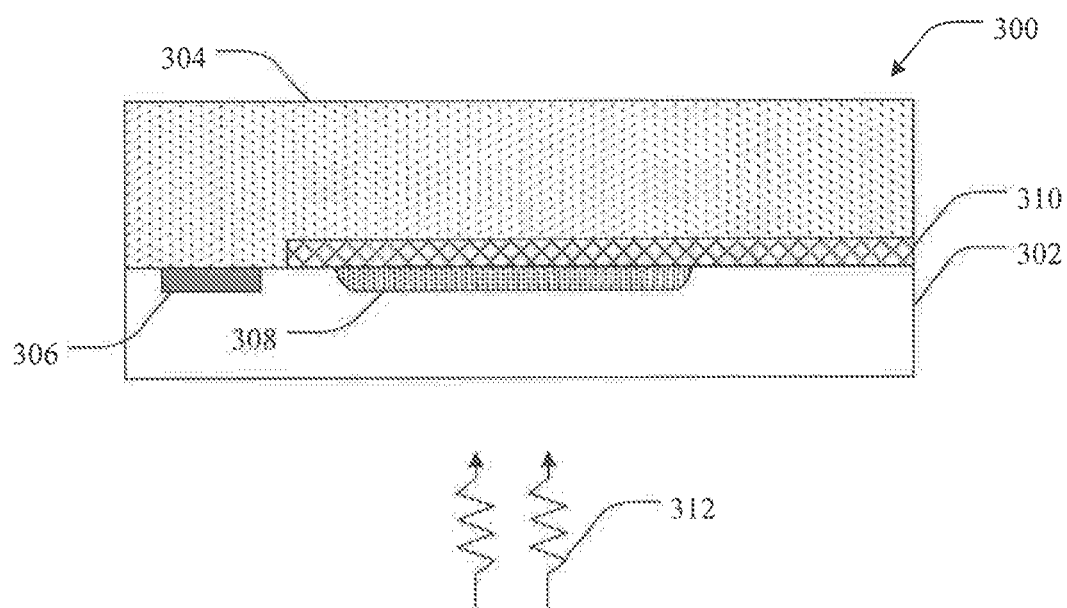
FIG. 3 is a cross-sectional view of an image sensor in accordance with another embodiment of the present disclosure.

Turning to FIG. 3, a BSI device is shown 300 having a semiconductor layer 302 coupled to a support substrate 304, where the semiconductor layer can include one or more doped regions 306, 308, that form at least one junction. In this case the support substrate 304 can be a circuitry layer or a bulk substrate including a circuitry layer. A textured layer 310 including an array or plurality of surface features is positioned between the semiconductor layer 302 and the support substrate 304. Light 312 is shown impinging on the device 300 and passing through the semiconductor layer 302 without contacting any circuit elements that may be positioned in or at the support substrate 304. Light 312 that is not absorbed by and subsequently passes through the semiconductor layer 302 contacts the textured layer 310 and is redirected back into the semiconductor layer 302. As with the FSI device shown in FIG. 2, the textured layer 310 increases the effective optical path length of the light 312 as it passed through the device. In one aspect, the semiconductor layer can be single crystal silicon.

The multiple doped regions for both the FSI and the BSI case can have the same doping profile or different doping profiles, depending on the device. Furthermore, any number or configuration of doped regions is considered to be within the present scope. In some aspects the semiconductor layer can be doped, and thus can be considered to be a doped region.

Additionally, the device can include deep trench isolation (DTI) to isolate the imager and to provide light trapping functionality. In some aspects such a device can include a silicon handle wafer in addition to the support substrate to facilitate manipulation of the device. In some aspects, the support substrate can be a silicon handle wafer. One technique for coupling a silicon handle wafer to the semiconductor layer includes oxide bonding. Further details regarding substrates, bonding, and various imager details can be found in U.S. patent application Ser. No. 13/069,135, which is incorporated herein by reference.

Optoelectronic devices according to aspects of the present disclosure can include photodiodes or pixels that are capable of absorbing electromagnetic radiation within a given wavelength range. Such imagers can be passive pixel sensors (PPS), active pixel sensors (APS), digital pixel sensor imagers (DPS), or the like. Such devices can also be architecturally configured as a three or four transistor active pixel sensor (3T APS or 4T APS). Additionally, devices having greater than 4 transistors are also within the present scope. Such devices can also include pinned photodiode architectures as used in CMOS imagers. Also, such optoelectronic devices can be used in time-of-flight (TOF) applications, as well as various structured light applications. It is also contemplated that such devices can also be configured as rolling shutter or global shutter readout devices.

In some aspects, a device can include a passivation layer positioned between the textured layer and the doped regions. In some aspects, the passivation layer can be doped to create a surface field, as is described more fully below. It is noted, that with or without the passivation region, the textured region can be located on the light incident side of the semiconductor material, on a side of the semiconductor material opposite the light incident side, or both on the light incident side and opposite the light incident side. Additionally, the device can also include an electrical transfer element coupled to the semiconductor layer and operable to transfer an electrical signal from the doped regions. Additionally, an electrical transfer element can include a variety of devices, including without limitation, transistors, sensing nodes, transfer gates, transfer electrodes, and the like.

As has been described, the textured layer is comprised of a plurality of surface features, where such surface features have been formed in an array or other grouping across an interface between the semiconductor layer and the support substrate. In some aspects, the textured region can cover the entire interface between the semiconductor layer and the support substrate, while in other aspects the textured region may cover only a portion of the interface between the semiconductor layer and the support substrate. For example, in one aspect the textured layer can cover the interface between the materials at least in regions where light passing through the semiconductor layer would contact the interface. In another aspect, the textured layer can cover the interface between the materials only in regions where light passing through the semiconductor layer would contact the interface. As such, it should be understood that the coverage area of the textured layer can be dependent on the design of the device, as well as the intended pattern of light trapping and/or light redirection that is desired. It is thus intended that the scope of the present disclosure not necessarily be limited by the degree to which the interface includes textured layer.

Furthermore, in some aspects one or more intervening layers can be present between the semiconductor layer and the support substrate. Such layers can be used to facilitate bonding, for reflecting light, for a variety of other purposes. In one aspect, for example, one or more bonding layers can be utilized to facilitate bonding the support substrate to the semiconductor layer. In such cases, it can be beneficial to apply a first bonding layer to the semiconductor layer and a second bonding layer to the support substrate as a bonding mechanism. The bonding layer can include a material capable of facilitating bonding between the support substrate and the semiconductor layer. Non-limiting examples can include silicon oxides, silicon nitrides, amorphous silicons, and the like. The thickness of a given bonding layer can additionally vary depending on the manufacturing techniques utilized and preferences of the designer. In one aspect, however, a bonding layer can be thick enough to facilitate bonding and thin enough to minimize waveguide effects within the device. In another aspect, a bonding layer can have a thickness of from about 30 nm to about 3 microns. In yet another aspect, a bonding layer can have a thickness of from about 40 nm to about 2 microns.

The position of the textured layer can thus be affected by the nature of the coupling of the support substrate and the semiconductor layer as well as the location where the textured layer is formed. In one aspect, the textured layer can be formed in or on the semiconductor layer. In another aspect, the textured layer can be formed in or on the support substrate. For the situation where the textured layer is formed in or on the semiconductor layer, one or more bonding layers can be coupled between the support substrate and the textured layer. If two or more bonding layers are utilized, a first bonding layer can be formed on the textured layer, a second bonding layer can be formed on the support substrate, and the first and second bonding layers can then be bonded together.

For the situation where the textured layer is formed in or on the support substrate, one or more bonding layers can be coupled between semiconductor layer and the textured layer. For example, in one aspect one or more bonding layer can be coupled between the support substrate and the surface features. If two or more bonding layers are utilized, a first bonding layer can be formed on the textured layer, a second bonding layer can be formed on the semiconductor layer, and the first and second bonding layers can then be bonded together.

As has been described, a light reflector layer can additionally be disposed between any two of the above referenced layers or materials. For example, in one aspect a reflector layer can be applied to one side of the textured layer. In another aspect, a reflector layer can be applied to either side of a bonding layer. In one specific aspect, a reflector layer can be positioned between a first and second bonding layer. The reflector layer can include any material capable of reflecting light back into the semiconductor layer. Non-limiting examples can include metals, ceramics, oxides, glass, distributed Bragg reflector stacks, and the like, including alloys and combinations thereof.

The surface features of the textured layer can be made by any process capable of etching in a repeatable and predictable manner. In one aspect, however, the surface features can be formed by any number of shallow trench isolation (STI) techniques. While such manufacturing techniques are known, they have previously been utilized for creating regions of electrical isolation between circuit elements. Thus, such implementations have been utilized around the peripheries of circuit elements. The present scope, however, is directed to creating arrays of surface features in locations to interact with light. Through this interaction, light can be redirected, diffused, focused, or otherwise manipulated by the surface feature array.

Additionally, STI techniques can be used to form such surface features having a variety of shapes, patterns, and the like. In one aspect, for example, the surface features can be arranged into an array according to a predetermined pattern. In one specific aspect, such a predetermined pattern can be a uniform or substantially uniform grid. Additionally, a predetermined pattern can be an organized, an ordered, or a periodic pattern. In another aspect, the predetermined pattern can be a non-uniform or a substantially non-uniform pattern. Surface feature array patterns can also be disordered, quasi-periodic, random, or the like.

As has been described, the textured layer can function to diffuse light, to redirect light, and to thus increase the quantum efficiency of the device. In some cases, a portion of the light passes through the semiconductor layer to contact the textured layer. The surface features of the textured layer thus facilitate an increase the effective optical path length of the semiconductor layer. Such surface features can be micron-sized and/or nano-sized, and can be any shape or configuration that can be formed via a STI technique. Non-limiting examples of such shapes and configurations include cones, pillars, pyramids, inverted features, trenches, gratings, protrusions, and the like, including combinations thereof. Additionally, factors such as manipulating the feature sizes, dimensions, material type, dopant profiles, texture location, etc. can allow tuning of the textured layer for a specific wavelength or range of wavelengths. In one aspect, tuning the device can allow specific wavelengths or ranges of wavelengths to be absorbed. In another aspect, tuning the device can allow specific wavelengths or ranges of wavelengths to be reduced or eliminated via filtering.

Textured layers according to aspects of the present disclosure can allow a semiconductor layer to experience multiple passes of light within the device, particularly at longer wavelengths (i.e. infrared). Such internal reflection can increases the effective optical path length, thus allowing a material such as silicon to absorb light at thicknesses that are less than standard silicon. As has been described, this increase in the effective optical path length of electromagnetic radiation in silicon increases the quantum efficiency of the device, thus leading to an improved signal to noise ratio.

The materials used for making the textured layer can vary depending on the design and the desired characteristics of the device. As such, any material that can be utilized in the construction of a textured region is considered to be within the present scope. In one aspect, the textured region can be formed directly on the semiconductor layer (e.g. a silicon epi-layer). In another aspect, an additional material can be deposited onto the semiconductor layer to support the formation of the textured layer. Non-limiting examples of such materials include semiconductor materials, dielectric materials, silicon, polysilicon, amorphous silicon, transparent conductive oxides, and the like, including composites and combinations thereof. In one specific aspect, the textured layer can be a textured polysilicon layer. Thus a polysilicon layer can be deposited onto the semiconductor layer, either directly or onto an intermediate passivation layer, and then textured to form the textured region. In another aspect, the textured layer can be a textured dielectric layer. In this case the textured layer can be a portion of a dielectric layer making up a passivation region disposed on the semiconductor layer. In yet another aspect the textured layer can be a transparent conductive oxide or another semiconductor material. In the case of dielectric layers, the textured layer can be a textured portion of a passivation layer or the textured layer can be formed from other dielectric material deposited over a passivation layer.

Various methods can be utilized to form STI features, and any such shallow trench formation technique is considered to be within the present scope. It is noted that, in one aspect, texturing techniques that involve laser ablation are specifically disclaimed from the present scope.

In some cases, the textured layer can be formed by using a patterned mask and photolithography, followed by etching to define a specific structure or pattern. In one aspect, STI techniques can be used to form the textured region. Various STI techniques are contemplated, and any such technique is considered to be within the present scope. In one non-limiting example, an oxide material is deposited on the material to be etched with shallow trenches. A uniform coating of a nitride material is deposited on the oxide material followed by a patterned coating of a resist material to be used as a mask. Thus the pattern of the mask will define the future pattern of the textured region. Any of a number of etch processes can then be applied across the layered material. As a result, regions of the layered material beneath the resist are protected from the etch, while regions of the layered material that are not located beneath the resist are etched by the process. This process is continued to produce a shallow trench (or a hole) etched in the unprotected regions between the resist material through the nitride material, the oxide material, and into the substrate. Following etching of the shallow trench, the resist material can be removed by any appropriate process. It is noted that, while the term "shallow trench" is used to describe the etching process, the resulting etch pattern is not limited to trenches, but also includes holes, pits, cones, and the like.

In some aspects, the etched regions can be left as open spaces. In other aspects, further processing can be performed to fill in the etched regions. For example, an oxide material can be deposited along the sides and bottom of the trenches similar to an oxide liner. Such can be deposited by a thermal oxide process, a direct oxide deposition, or any other useful process. Once the etched regions are sufficiently filled, the resulting surface can be further processed by techniques such as CMP processing, and then, once exposed, the nitride layer can be removed.

In another aspect, the etched regions can be highly doped along sidewalls and/or bottoms with a dopant profile to create a surface field. A back surface field can function to impede the movement of photo-generated carriers from the junction toward the textured layer, and as such the dopant profile should be designed accordingly. The use of the back surface field in the etched regions can thus be used to electrically passivate the regions around the textured layer.

Figure 4:
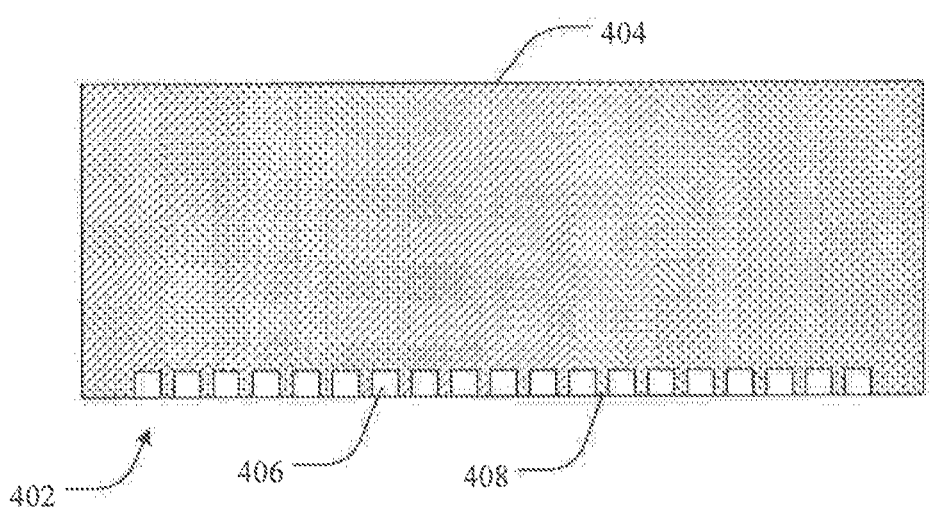
FIG. 4 is a cross-sectional view of a textured layer associated with a substrate in accordance with another embodiment of the present disclosure.

The surface features can have a variety of configurations, structures, and sizes, depending on the desired characteristics of the resulting device. In one aspect, as is shown in FIG. 4 for example, surface features 402 are shown formed in a material layer 404, such as, for example, the semiconductor layer. The surface features in this case are arranged uniformly as a uniform grid pattern comprised of a series of spaces or holes 406 and lines 408 or pillars. Various uniform grid patterns are contemplated, and in one aspect the pattern can include a uniformly spaced series pillars surrounded by spaces, or vice versa depending on whether the pattern is viewed from the topside or the bottom side of the etched material. In another aspect, the uniform grid pattern can include a series of lines surrounding a uniformly spaced series of spaces or holes cut between the lines, or vice versa.

Figure 5:
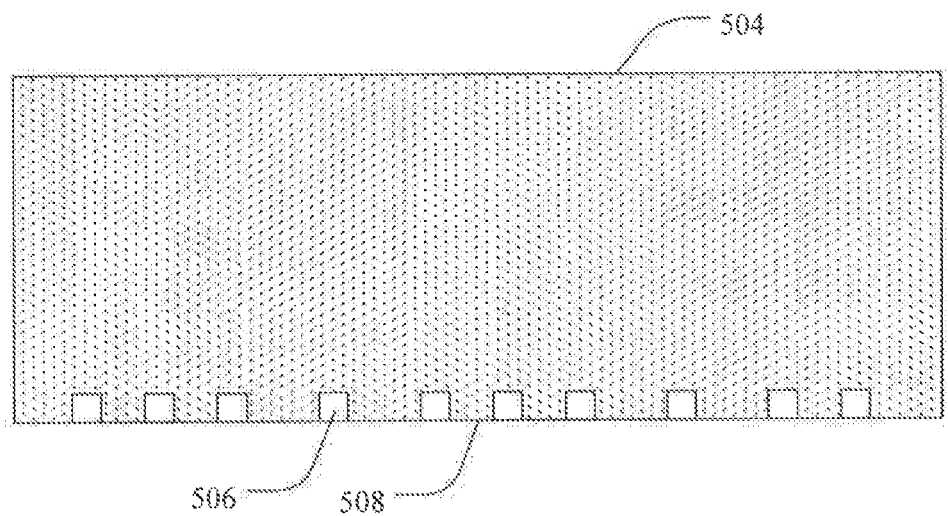
FIG. 5 is a cross-sectional view of a textured layer associated with the substrate in accordance with another embodiment of the present disclosure.
Figure 6:
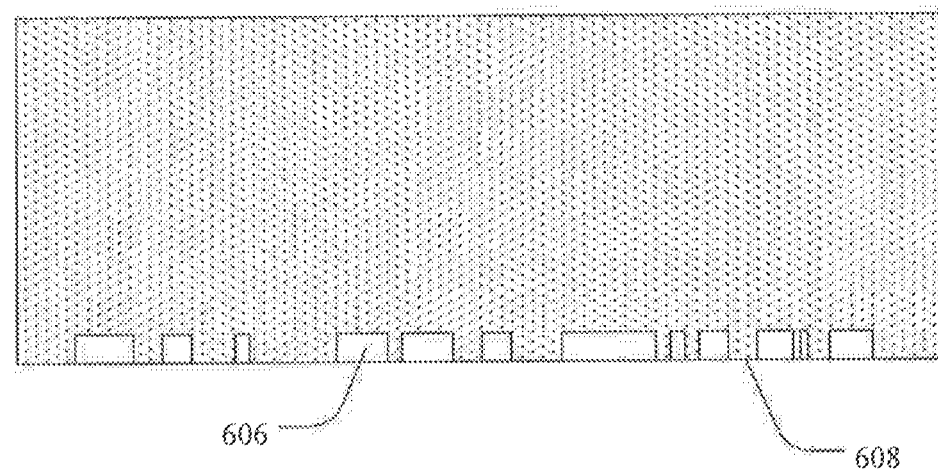
FIG. 6 is a cross-sectional view of a textured region associated with the substrate in accordance with another embodiment of the present layer.

Additionally, as has been described, the etch pattern of surface features can be a predetermined nonuniform pattern. As is shown in FIG. 5, for example, the spaces 506 etched into the material layer 504 are of approximately the same size and shape and the lines or pillars 508 vary in width. FIG. 6 shows an etch pattern were both the spaces 606 and the lines or pillars 608 are varied. It should be noted that a variety of etch patterns are contemplated, and that the present scope should not be limited thereby. With respect to nonuniform patterns, in some aspects the patterns can be random, either for the line or pillar, the spaces, or both.

In addition to the pattern formed by the STI process, the depth of the etch can also have an impact on optical absorption. In one aspect, for example, the surface features can have a uniform or substantially uniform depth or height. While the depth or height can vary depending on the intended use and design of the device, in one aspect the height or depth can be from about 50 nm to about 2 microns. It is noted that, in standard STI processes, the processing depth is about 0.35 microns, which is also considered to be within the present scope. In another aspect, the surface features can have a non-uniform depth or height, and thus can vary across the surface of the textured layer. Such variation in depth can be random in some cases, and nonrandom in other cases depending on the desired design of the device. In one aspect, the depth or height can be from about 50 nm to about 2 microns. In some aspects discrete levels of depths can be utilized. For example, in one aspect one level may have a depth of 0.35 microns, while another level may have a depth of 0.7 microns. By using different masks, different depth levels can be achieved. Similarly, subsequent levels can be etched to create a third level, a fourth level, or more. It is noted that in some aspects each level can have a depth of from about 50 nm to about 2 microns.

As has been described, the various devices according to aspects of the present disclosure can exhibit increased absorption as compared to traditional photosensitive devices. For example, for an active semiconductor layer according to aspects of the present disclosure that has a thickness of from about 1 micron to about 10 microns, the absorption characteristics can be as follows: in one aspect the semiconductor layer can absorb from about 60% to about 80% of incident 700 nm light; in another aspect, the semiconductor layer can absorb from about 40% to about 60% of incident 850 nm light; in yet another aspect, the semiconductor layer can absorb from about 25% to about 40% of incident 940 nm light; in a further aspect, the semiconductor layer can absorb from about 15% to about 30% of incident 1000 nm light; and in yet a further aspect, the semiconductor layer can absorb from about 5% to about 10% of incident 1064 nm light. Furthermore, depending on the architecture, devices according to aspects of the present disclosure can exhibit external quantum efficiencies (EQE) that are from about 1% to about 5% less than the above described absorption values for a given wavelength of light. Additionally, it is further noted that the devices of the present disclosure have at least substantially the same dark current as a standard EPI device with no textured region.

While the present disclosure has focused on silicon materials, it should be understood that a variety of semiconductor materials are also contemplated for use and should be considered to be within the present scope. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof. In yet another aspect, the semiconductor materials can include any material that is useful for making imagers, including, Si, SiGe, InGaAs, and the like, including combinations thereof.

A silicon semiconductor layer can be of any thickness that allows electromagnetic radiation detection and conversion functionality, and thus any such thickness of silicon material is considered to be within the present scope. In some aspects the textured layer increases the efficiency of the device such that the silicon material can be thinner than has previously been possible. Decreasing the thickness of the silicon material reduces the amount of silicon required to make such a device. In one aspect, for example, the silicon material has a thickness of from about 500 nm to about 50 µm. In another aspect, the silicon material has a thickness of less than or equal to about 100 µm. In yet another aspect, the silicon material has a thickness of from about 1 µm to about 10 µm. In a further aspect, the silicon material can have a thickness of from about 5 µm to about 50 µm. In yet a further aspect, the silicon material can have a thickness of from about 5 µm to about 10 µm.

A variety of dopant materials are contemplated for both the formation of the multiple doped regions and to create a surface field at the shallow trench regions, and any such dopant that can be used in such processes is considered to be within the present scope. It should be noted that the particular dopant utilized can vary depending on the material being doped, as well as the intended use of the resulting material.

A dopant can be either charge donating or accepting dopant species. More specifically, an electron donating or a hole donating species can cause a region to become more positive or negative in polarity as compared to the semiconductor layer. In one aspect, for example, the doped region can be p-doped. In another aspect the doped region can be n-doped. A highly doped region can also be formed on or near the doped region to create a pinned diode. In one non-limiting example, the semiconductor layer can be negative in polarity, and a doped region and a highly doped region can be doped with p+ and n dopants respectively. In some aspects, variations of n(--), n(-), n(+), n(++), p(--), p(-), p(+), or p(++) type doping of the regions can be used.

In one aspect, non-limiting examples of dopant materials can include S, F, B, P, N, As, Se, Te, Ge, Ar, Ga, In, Sb, and combinations thereof.

What is claimed is:

1. An optoelectronic image sensor device having enhanced absorption of electromagnetic radiation, comprising:
    a semiconductor layer coupled to a support substrate; and
    an array of shallow trench isolation surface features formed on at least a portion of a surface of the support substrate and positioned between the semiconductor layer and the support substrate, the surface features positioned to interact with electromagnetic radiation that passes through the semiconductor layer.

2. The device of claim 1, wherein the semiconductor layer is single crystal silicon.

3. The device of claim 1, further comprising a first bonding layer coupled between the semiconductor layer and the support substrate.

4. The device of claim 3, wherein the first bonding layer is coupled between the support substrate and the surface features.

5. The device of claim 3, further comprising a second bonding layer positioned between the first bonding layer and the support substrate.

6. The device of claim 5, further comprising a reflector layer disposed between the first bonding layer and the second bonding layer.

7. The device of claim 1, wherein the surface features are formed in the support substrate.

8. The device of claim 1, wherein the surface features are formed in the semiconductor layer.

9. The device of claim 1, wherein the surface features are arranged according to a predetermined pattern.

10. The device of claim 9, wherein the predetermined pattern is an at least substantially uniform grid.

11. The device of claim 9, wherein the predetermined pattern is a non-uniform arrangement.

12. The device of claim 1, wherein the surface features have an at least substantially uniform height.

13. The device of claim 1, wherein the surface features are not uniform in height.

14. The device of claim 1, further comprising a device layer coupled to the semiconductor layer on a side opposite the surface features.

15. The device of claim 1, wherein the device is architecturally configured as a front-side illuminated optoelectronic device.

16. The device of claim 1, wherein the device is architecturally configured as a back-side illuminated optoelectronic device.

17. A method of making an optoelectronic image sensor device, comprising:
    creating an array of surface features on at least a portion of a surface of a support substrate using shallow trench isolation etching; and
    bonding the array of surface features between the support substrate and a semiconductor layer.

18. The method of claim 17, wherein creating the array of surface features further comprises creating the array of surface features on at least a portion of a surface of the semiconductor layer.

19. The method of claim 17, wherein creating the array of surface features further comprises creating the array of surface features on at least a portion of a surface of the semiconductor layer.

20. The method of claim 17, wherein bonding the array of surface features between the support substrate and the semiconductor layer further includes:
    depositing a first bonding layer onto the semiconductor layer; and
    bonding the first bonding layer to a second bonding layer disposed on the support substrate.

* * * * *